United States Patent [19]

Hayakawa

[11] Patent Number: 5,263,040
[45] Date of Patent: Nov. 16, 1993

[54] STRAINED QUANTUM WELL LASER DIODE

[75] Inventor: Toshiro Hayakawa, Yokohama, Japan

[73] Assignee: Eastman Kodak Company, Rochester, N.Y.

[21] Appl. No.: 902,213

[22] Filed: Jun. 22, 1992

[30] Foreign Application Priority Data

Dec. 4, 1991 [JP] Japan .................................. 3-320391

[51] Int. Cl.⁵ ............................................... H01S 3/19
[52] U.S. Cl. ............................................ 372/45; 257/18
[58] Field of Search ....................... 372/45; 257/14, 18

[56] References Cited

U.S. PATENT DOCUMENTS

| | | | |
|---|---|---|---|
| 4,894,836 | 1/1990 | Hayakawa et al. | 372/45 |
| 4,974,231 | 11/1990 | Gomyo | 372/45 |
| 5,146,466 | 9/1992 | Hamada et al. | 372/45 |

OTHER PUBLICATIONS

W. T. Tsang, "Semiconductors and Semimetals," vol. 24, pp. 397, Academic Press, San Diego (1987).
Physics and Applications of Semiconductor Superlattices, Physical Society of Japan Annals, Baifukan, p. 213 (1984).
P. Bour et al., SPIE vol. 1219, Laser-Diode Technology and Application II, p. 43 (1990).
G. C. Osbourn, "Semiconductors and Semimetals," vol. 24, p. 459, (1987).

*Primary Examiner*—Georgia Y. Epps
*Attorney, Agent, or Firm*—Raymond L. Owens

[57] ABSTRACT

A strained quantum well laser diode in which higher reliability is achieved by reducing the degrading effects of stress. By using an active layer orientation that is equal or close to (111), it is possible to suppress degradation caused by stress, which acts in a direction parallel to the quantum well layer.

3 Claims, 6 Drawing Sheets

STRAINED QUANTUM WELL LASER DIODE

BACKGROUND OF THE INVENTION

1. Field of the Invention

The present invention relates to a quantum well laser diode, particularly to a high-efficiency, low drive-current quantum well laser diode.

2. Description of the Prior Art

In recent years, optical communication technology and optical information processing are playing major roles in various fields. For example, digital optical communication using optical fibers has made possible large increases in data communication densities, and optical disks and laser printers have produced a considerable expansion of the range of optical information processing applications.

The progress of optical communications and optical information processing technology owes much to advances made in the laser diodes used as light sources. The small size and high efficiency that are features of laser diodes have brought these devices into widespread use, for example as light sources for compact disk systems, video disk systems, bar code readers and optical communication systems.

In a laser diode the lasing action is generated by the injection of electrons into a P-N junction active layer. Recent advances in semiconductor technology such as MBE (molecular beam epitaxy) and MOCVD (metalorganic chemical vapor deposition) that make it possible to grow epitaxial layers as thin as 1 nm or less, have led to the realization of laser diodes that use quantum well active layers less than 20 nm thick, with higher levels of efficiency and lower drive current requirements (see W. T. Tsang in "Semiconductors and Semimetals" vol. 24, pp 397, Academic Press, San Diego (1987)).

While MBE and MOCVD have made it possible to grow epitaxial layers with relatively good uniformity, when using a laser diode to excite a solid state laser or fiber amplifier, it is necessary to set the frequency of the excitation laser diode to match the absorption frequency range of each of the media involved, for which a minimum frequency precision of 1 nm is desirable. As a consequence a very high order of epitaxial precision is required in the laser diode fabrication process. This is no easy task, and in practice it is a matter of selecting diodes having the required matching frequency In the case of quantum well laser diodes, in particular, care is needed as decreasing the well width of the quantum well raises the conduction band and valence band quantum level energy, reducing the oscillation wavelength, so the smaller the well width the greater the degree of change in the oscillation frequency based on the well width (see pp 213 of Physics and Applications of Semiconductor Superlattices, Physical Society of Japan Annals, Baifukan (1984)).

Among such quantum well laser diodes, recently there has been much work on the development of 980 nm laser diodes for use as the excitation light source of Er doped fiber amplifiers. Most of these are strained quantum well lasers on a GaAs substrate, with an InGaAs quantum well and AlGaAs/GaAs cladding layer or optical waveguide layer (see for example P. Bour et al, SPIE vol. 1219, Laser-Diode Technology and Application II (1990), pp 43).

However, with a strained quantum well, a high In content will produce an increase in the mismatch between the lattice constant of the surrounding AlGaAs/GaAs layers and that of the InGaAs quantum well and, moreover, increasing the thickness of the quantum well produces an increase in the overall forces acting on the quantum well. A larger strain therefore gives rise to lattice relaxation as transfers take place, causing high-density lattice defects that produce a sharp deterioration in crystallinity (see G. C. Osbourn in "Semiconductors and Semimetals" vol. 24, pp 459 (1987)). Therefore, while the oscillation wavelength can be controlled by changing the In content and the quantum well width, the range of this control is limited. Particularly with InGaAs/GaAs/AlGaAs system quantum well laser diodes, in order to extend the 830 nm to 870 nm oscillation frequency of an unstrained GaAs quantum well, it is necessary to increase the In content by a considerable amount or use a wider quantum well.

Thus, the fact that lengthening the wavelength increases the amount of strain means there is a limit to the degree by which the wavelength can be increased. In particular, the strain acting on the active layer of semiconductor lasers during laser operation is a cause of accelerated device degradation, so too large a degree of strain is therefore undesirable.

SUMMARY OF THE INVENTION

An object of the present invention is therefore to provide a more reliable strained quantum well laser diode.

In accordance with the present invention, this object is attained by a quantum well laser diode that has a quantum well active layer, in which there is a difference of 0.1% or more between the lattice constant of the quantum well active layer and the lattice constant of the layers adjacent to the quantum well active layer and the active layer has a crystal orientation that is within ±10 degrees of the (111) surface plane.

As mentioned, in order to lengthen the oscillation wavelength of a non-strained (a difference of 0.1% or less between the lattice constant of the active layer and that of layers adjacent to the active layer) GaAs quantum well to around 980 nm, the indium content has to be increased. However, increasing the indium content produces strain in the active layer (a difference of more than 0.1% between the lattice constant of the active layer and that of layers adjacent to the active layer), giving rise to the problem of degradation of the crystallinity. In accordance with this invention, the lengthening of the wavelength can be achieved while at the same time avoiding degradation, by using a quantum well active layer that has a crystal orientation of approximately (111), or more specifically, a crystal orientation that is within ±10 degrees of the (111) surface plane, whereas in the conventional arrangement an orientation of (100) is used.

Further features of the invention, its nature and various advantages will be more apparent from the accompanying drawings and following detailed description of the invention.

DETAILED DESCRIPTION OF THE INVENTION

Figure 1:
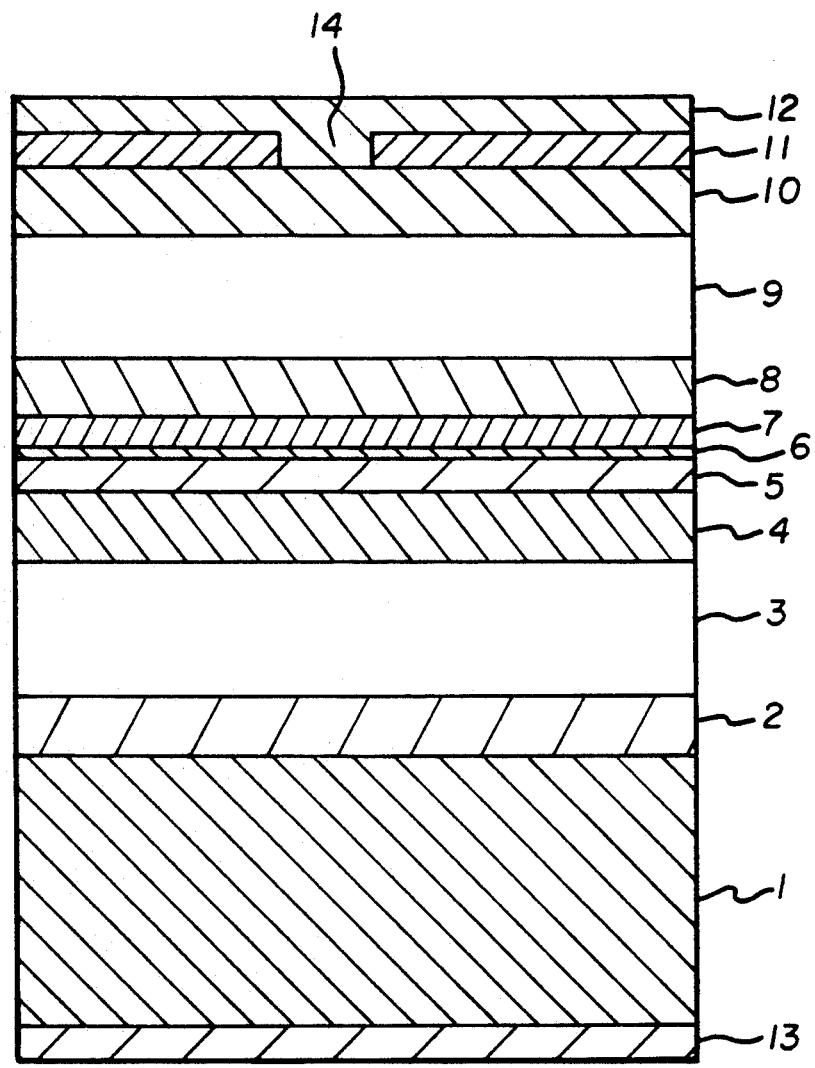
FIG. 1 is a cross-sectional view of a first embodiment of a quantum well laser diode according to the present invention.

FIG. 1 is a cross-sectional view of an InGaAs/GaAs/AlGaAs strained quantum well laser diode according to a first embodiment of the present invention. Molecular beam epitaxy (MBE) was used to form an n-GaAs buffer layer 2 ($Si=1\times10^{18}$ cm$^{-3}$, 0.5 $\mu$m thick) on an n-GaAs substrate 1 ($Si=2\times10^{18}$ cm$^{-3}$) having a plane orientation with an inclination of 0.5 degrees from the (111) B surface plane toward the (100) surface plane, and this was followed by the formation of an n-$Al_{0.45}Ga_{0.55}As$ cladding layer 3 ($Si=1\times10^{18}$ cm$^{-3}$, 1.5 $\mu$m thick), a non-doped $Al_{0.15}Ga_{0.85}As$ optical waveguide layer 4 (0.2 $\mu$m thick), a non-doped GaAs barrier layer 5 (0.05 $\mu$m thick), a non-doped $In_{0.2}Ga_{0.8}As$ strained quantum well layer 6 (0.01 $\mu$m thick), a non-doped GaAs barrier layer 7 (0.05 $\mu$m thick), a non-doped $Al_{0.15}Ga_{0.85}As$ optical waveguide layer 8 (0.2 $\mu$m thick), a p-$Al_{0.45}Ga_{0.55}As$ cladding layer 9 ($Be=1\times10^{18}$ cm$^{-3}$, 1.5 $\mu$m thick) and a p-GaAs cap layer 10 ($Be=1\times10^{19}$ cm$^{-3}$, 0.2 $\mu$m thick). In doing this, special care is required as AlGaAs and InGaAs have different optimum growth conditions. In this embodiment, growth of the n-GaAs buffer layer 2 started at 620° C. and proceeded until a thickness of 0.2 $\mu$m was reached, and the growth temperature was then gradually increased to 720° C. and a further 0.1 $\mu$m of n-GaAs buffer layer was grown. The n-$Al_{0.45}Ga_{0.55}As$ cladding layer 3 and the non-doped $Al_{0.15}Ga_{0.85}As$ optical waveguide layer 4 were also then grown at 720° C., and during the growth of the non-doped GaAs barrier layer 5 the temperature was gradually reduced to 620° C. to grow the non-doped $In_{0.2}Ga_{0.8}As$ strained quantum well layer 6. Next, during the growth of the non-doped GaAs barrier layer 7 the temperature was again gradually raised to 720° C. to grow the non-doped $Al_{0.15}Ga_{0.85}As$ optical waveguide layer 8, p-$Al_{0.45}Ga_{0.55}As$ cladding layer 9 and p-GaAs cap layer 10. Thus fabricating the materials under the respective optimum conditions, which are a higher temperature for the AlGaAs and a lower temperature for the InGaAs, makes it possible to realize good crystallinity. To change the temperature without interrupting the growth process, the growth temperature was changed during formation of a GaAs layer, which has a lower growth temperature dependency than other layers, thereby preventing the boundary degradation that accompanies interruption of the growth process. Compared to the formation of the (100) orientation layers used in the prior art, the range of optimum conditions for growing (111) orientation layers is narrower, which means that in order to achieve good quality devices it is necessary to optimize the growth conditions. Moreover, to avoid defects during the MBE process such as stress-induced slip lines, the n-GaAs substrate was affixed to the holder by mechanical means rather than by In solder. A $SiN_x$ layer 11 (3000 thick) was then formed by means of plasma CVD, and photolithography together with chemical etching using dilute HF were then used to remove part of the $SiN_x$ layer so as to form a 50-$\mu$m-wide strip-shaped window 14. Finally, vacuum deposition was used to form a Mo/Au electrode layer 12 on the p-GaAs cap layer side and a AuGe/Ni/Au electrode layer 13 on the n-GaAs substrate side, which was followed by annealing at 450° C. for five minutes to form ohmic electrodes.

Figure 2:
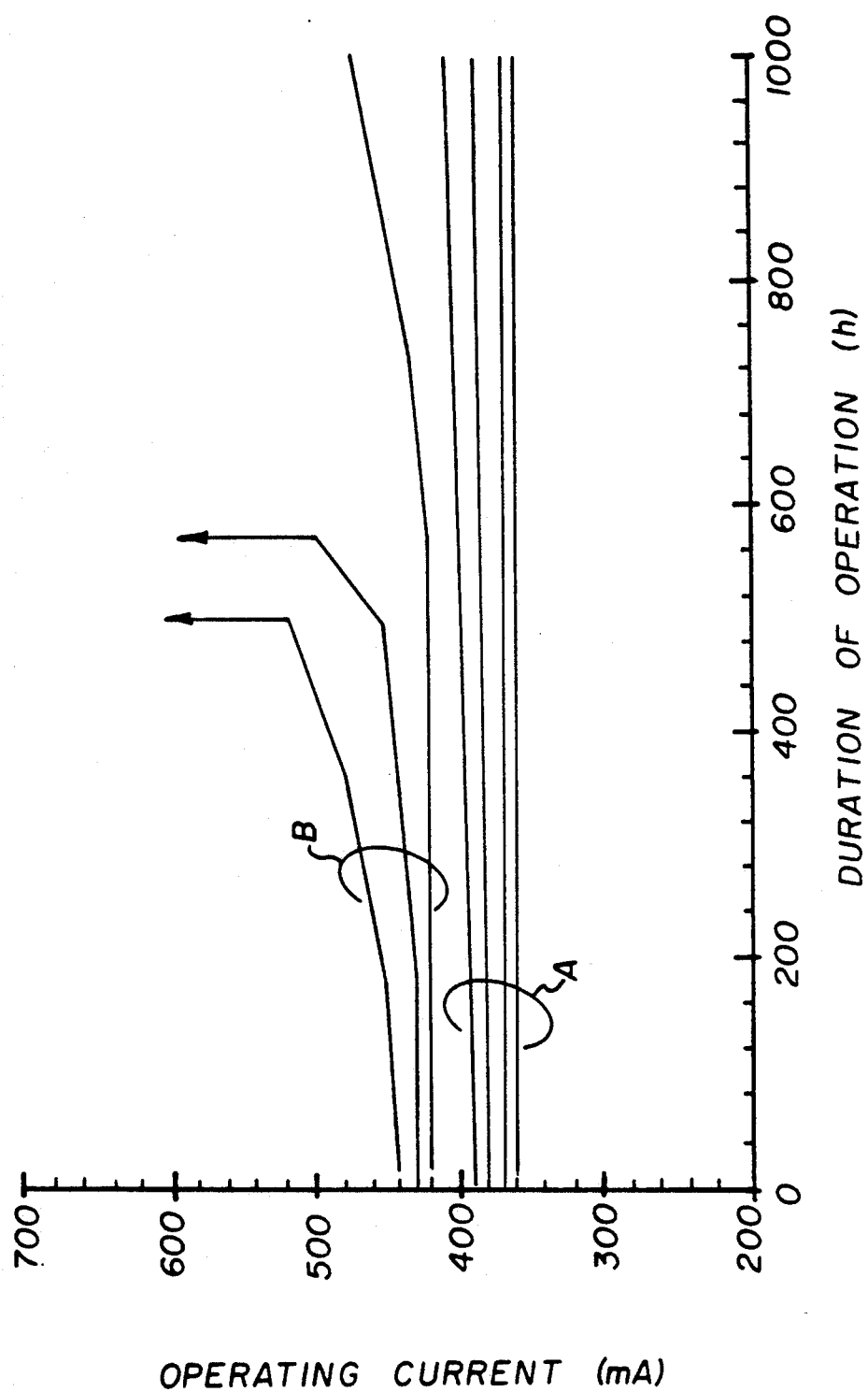
FIG. 2 is a graph of the results of comparative performance tests of the laser diode of this invention (A) and a conventional laser diode (B)

The wafer thus fabricated was cleaved to form a resonator 500 $\mu$m long. Electron-beam deposition was then used to provide the front end with an $Al_2O_3$ coating having a reflectance of 10%, and the rear end was provided with a multilayer coating of 95% -reflectance $Al_2O_3$ followed by amorphous silicon, this sequence being then repeated. The wafer was then cut into chips 500 $\mu$m wide which were then each In-soldered onto a copper heat sink and the characteristics were measured. At 25° C. the device oscillated at a threshold current of 70 mA, producing an optical output of 500 mW from the front end; oscillation wavelength was around 980 nm. For comparison, the same process and conditions were used to fabricate a laser device on an n-GaAs substrate ($Si=2\times10^{18}$ cm$^{-3}$) with an ordinary (100) orientation; oscillating at 895 nm and a threshold current of 80 mA, this also provided an optical output of 500 mW from the front end. These devices were subjected to performance tests, using a constant output of 250 mW at 30° C.; the results are shown in FIG. 2, with A denoting laser devices with a substrate fabricated according to the present invention with a (111) plane orientation, and B laser devices with a conventional substrate fabricated with a (100) plane orientation. From the graph it can be seen that the laser devices with the inventive (111) substrate exhibited better stability than those with the conventional (100) substrate. About 10% of the devices (both those with a (111) substrate and those with a (100) substrate) exhibited initial degradation within 200 hours of the start of the performance testing. Because In soldering was not used in the MBE formation process, no degradation caused by slip lines and other such defects was observed.

The above comparison was made using the same In composition and quantum well width, so the stress acting on the quantum well was the same. The reason for the lower degree of degradation in the devices that have a substrate with a (111) orientation is that the stress acts in a direction parallel to the quantum well layer. In each type of device the stress acts in a different direction to that of the (100) and (111) planes, which results in less degradation in the case of (111) strained quantum well lasers. The degradation mechanism of strained quantum well lasers is not yet clear, but the reason for this is considered to be that, the major factor acting to accelerate the spread of the defects that contribute to the degradation is stress that acts in a direction that is close to the (100) orientation, and as a result the cosine of the stress in that direction is larger in a (100) strained quantum well than it is in the case of a (111) strained quantum well.

The comparison also shows that when the construction is the same, the oscillation wavelength of a (111) strained quantum well is longer than that of a (100) strained quantum well. This is because the effective mass of heavy positive holes in the (111) direction is more than twice that in the (100) direction, and as a result, for the same quantum well width there is a smaller quantization energy increase.

In actual applications in which the same oscillation wavelengths are required, in the case of the above example, for instance, in order to obtain an oscillation wavelength of 980 nm with a (100) orientation laser it is necessary to further increase the width of the quantum well, the result of which is a further increase in the amount of stress. For the same oscillation wavelength, this gives the (111) strained quantum well laser according to this invention a further advantage compared to a (100) strained quantum well laser.

Figure 3:
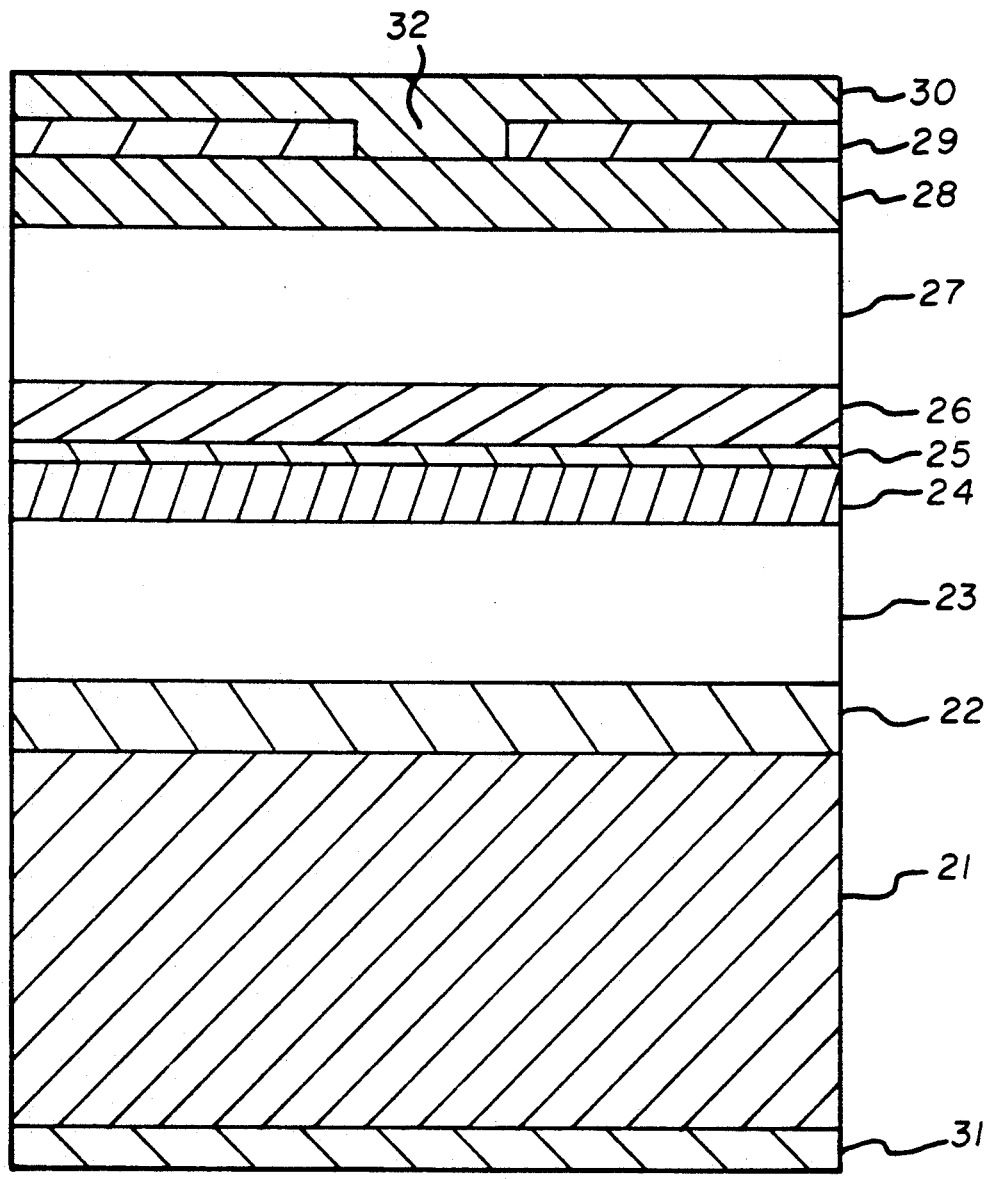
FIG. 3 is a cross-sectional view of another embodiment of the quantum well laser diode according to this invention.

FIG. 3 is a cross-sectional view of an InGaAs/GaAs/AlGaAs system quantum well laser according to a second embodiment of this invention. MBE was used to form an n-GaAs buffer layer 22 (Si=$1\times10^{18}$ cm$^{-3}$, 0.5 μm thick) on an n-GaAs substrate 21 (Si=$2\times10^{18}$ cm$^{-3}$) having a plane orientation with an inclination of 0.5 degrees from the (111) B surface plane toward the (100) surface plane, and this was followed by the formation of an n-Al$_{0.5}$Ga$_{0.5}$As cladding layer 23 (Si=$1\times10^{18}$ cm$^{-3}$, 1.5 μm thick), a non-doped Al$_{0.25}$Ga$_{0.75}$As optical waveguide layer 24 (0.1 μm thick), a non-doped In$_{0.05}$Ga$_{0.9}$Al$_{0.05}$As strained quantum well layer 25 (0.01 μm thick), a non-doped Al$_{0.25}$Ga$_{0.75}$As optical waveguide layer 26 (0.1 μm thick), a p-Al$_{0.5}$Ga$_{0.5}$As cladding layer 27 (Be=$1\times10^{18}$ cm$^{-3}$, 1.5 μm thick) and a p-GaAs cap layer 28 (Be=$1\times10^{19}$ cm$^{-3}$, 0.2 μm thick). Unlike the first embodiment shown in FIG. 1, in this second embodiment, during growth of the n-GaAs buffer layer 22 the temperature was raised from 620° C. to 720° C., and proceeded with the temperature maintained at a constant 720° C. However, in view of the fact that at this high temperature of 720° C. there is considerable revaporization of the indium, to compensate for the revaporization amount an In beam is provided with 50 or more times the total indium taken up by the crystal growth process.

Figure 4:
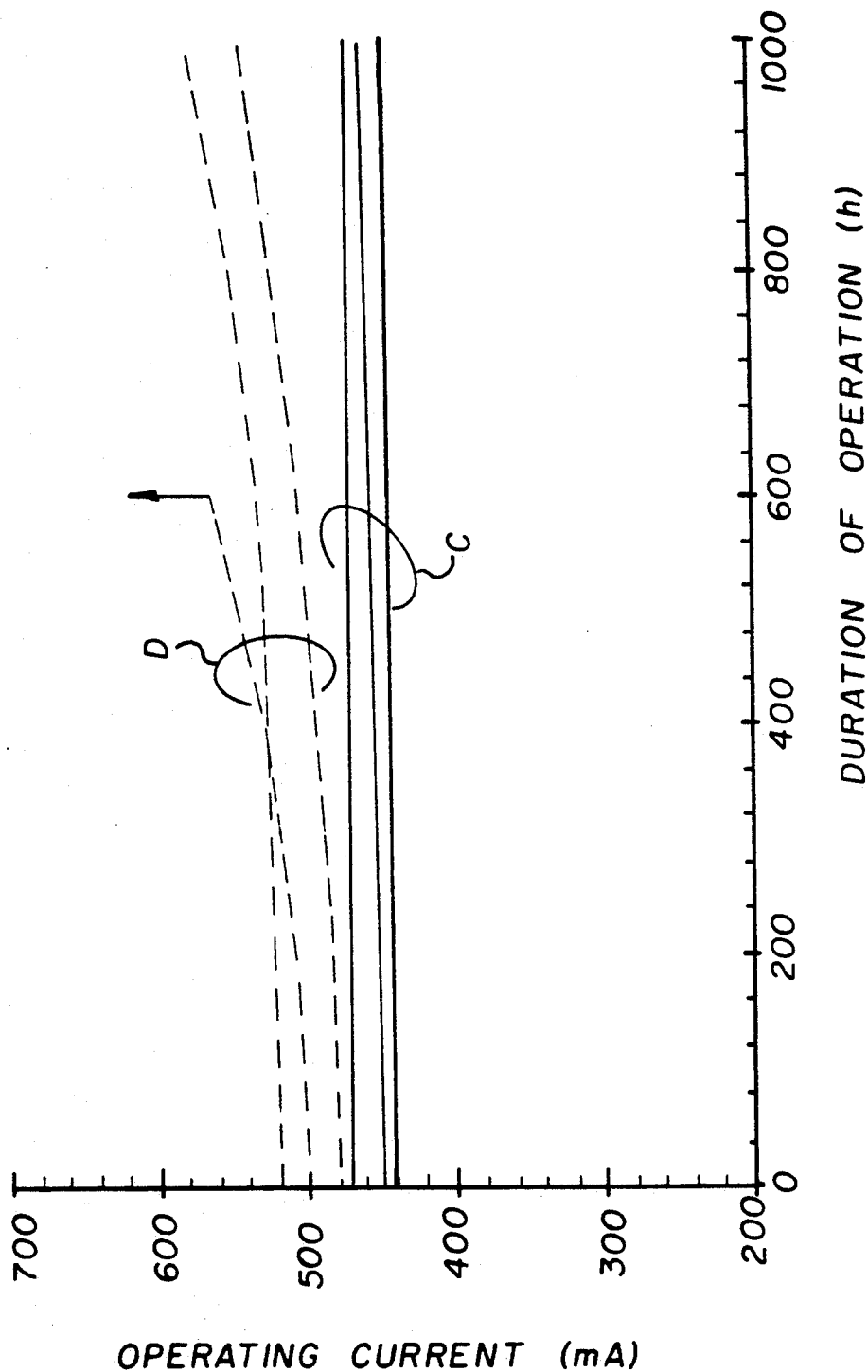
FIG. 4 is a graph of the results of comparative performance tests of the laser diode of this embodiment (C) and a conventional laser diode (D)

The MBE growth was followed by the same processes used in the first embodiment to fabricate the laser device and measure the characteristics. At 25° C. the device oscillated at a threshold current of 100 mA, producing an optical output of 500 mW from the front end; the oscillation wavelength was around 850 nm. For comparison, the same process and conditions were used to fabricate a laser device on an n-GaAs substrate (Si=$2\times10^{18}$ cm$^{-3}$) with an ordinary (100) orientation; oscillating at 845 nm and a threshold current of 110 mA, this also provided an optical output of 500 mW from the front end. These devices were subjected to performance tests, using a constant output of 250 mW at 30° C.; the results are shown in FIG. 4. From FIG. 4 it can be seen that the laser devices with the inventive (111) substrate, denoted by C, exhibited better stability than those with the conventional (100) substrate, denoted by D.

Figure 5:
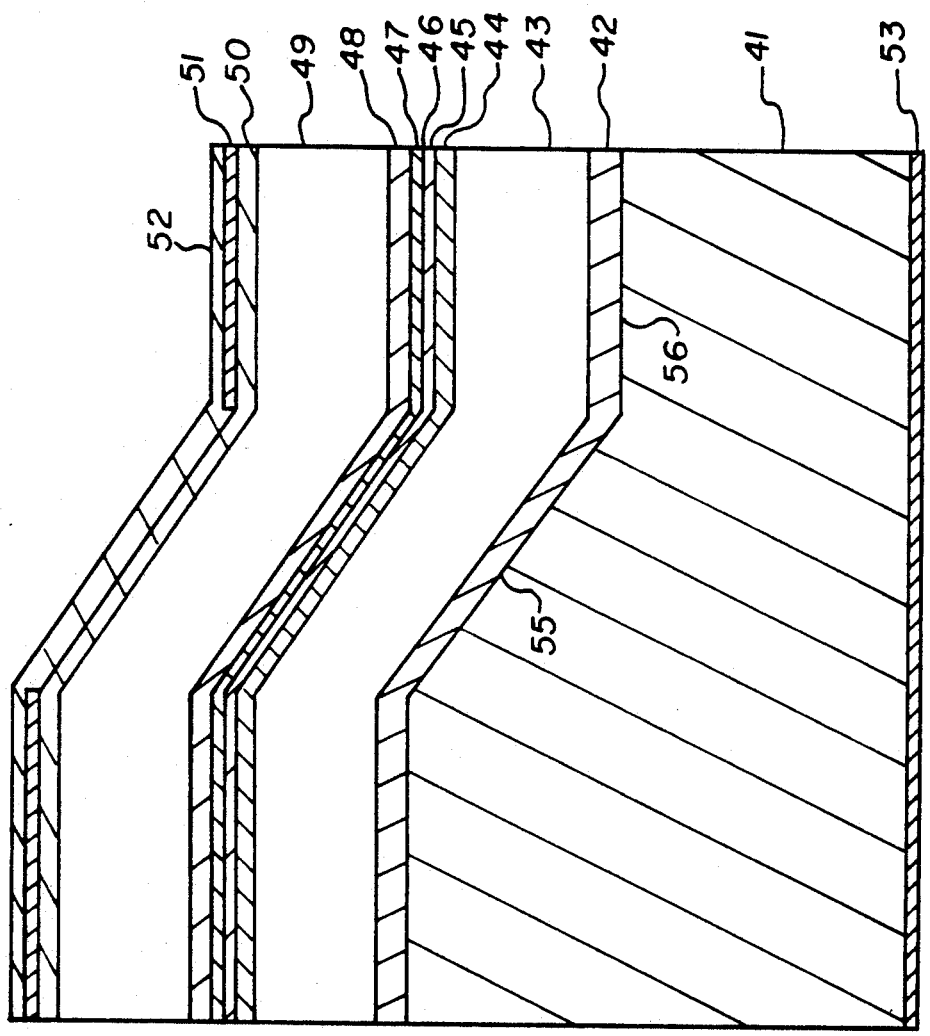
FIG. 5 is a cross-sectional view of a further embodiment of the quantum well laser diode of this invention.
Figure 6:
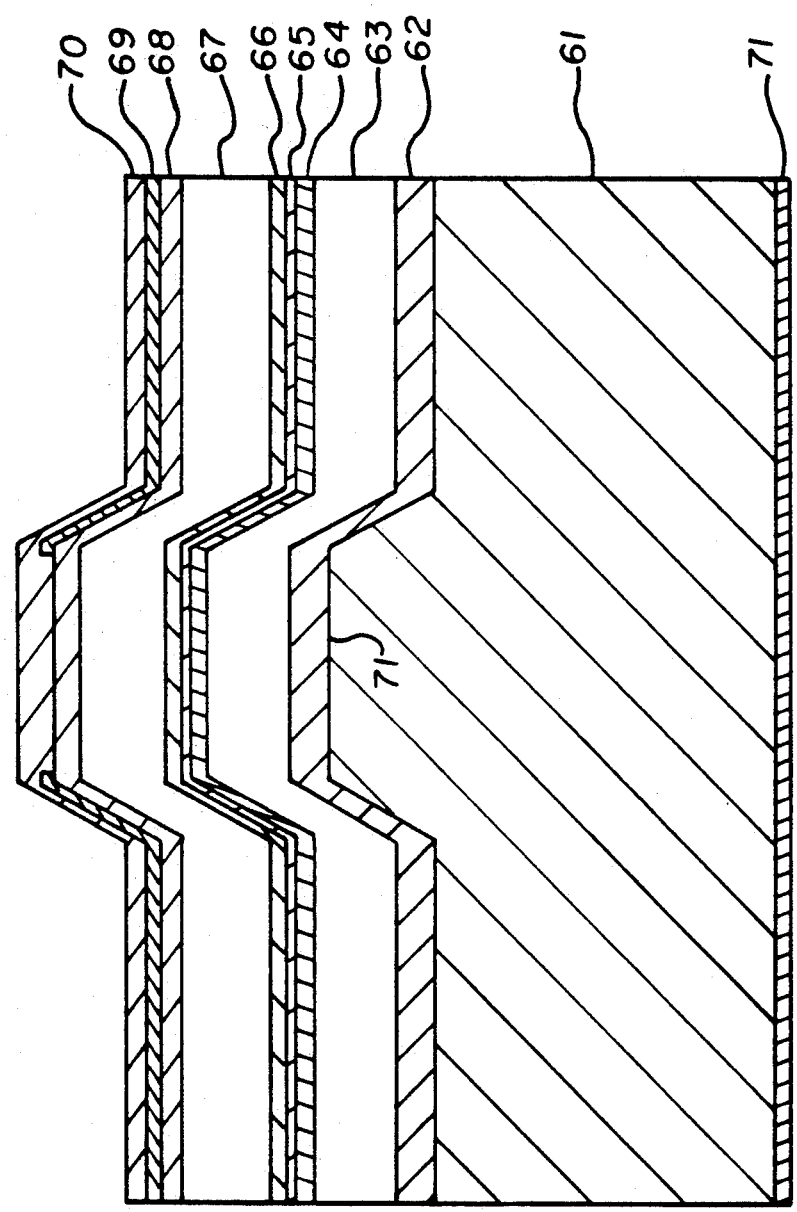
FIG. 6 is a cross-sectional view of another embodiment of the quantum well laser diode of the invention.

Although the above embodiments have been described with reference to InGaAs/GaAs/AlGaAs system and InGaAlAs/AlGaAs system strained quantum well semiconductor lasers on a GaAs substrate, it is to be understood that the present invention is not limited thereto and may be applied to strained quantum well semiconductor lasers of other materials such as InGaAlAs or InGaAs on an InP substrate, for example. Also, while the above embodiments used a substrate having an inclination of 0.5 degrees from the (111) B plane, this was to optimize the growth conditions of the MBE process that was used. However, the invention is not strictly limited to this plane orientation when other growth processes are used such as MOVPE, or even when MBE is used but with different conditions. It is considered that the above-described stress magnitude and anisotropy of the heavy positive holes will provide an effect over that of the conventional (100) orientation, if the active region of the strained quantum well laser is provided on a plane within ±10 degrees of the (111) A surface or (111) B surface. It is not necessary for the entire surface of the substrate to have a (111) plane orientation. FIGS. 5 and 6 show such examples. The InGaAs/GaAs/AlGaAs strained quantum well laser arrangement of FIG. 5 is substantially the same as the InGaAs/GaAs/AlGaAs strained quantum well laser arrangement shown in FIG. 1, being constituted as follows. An n-GaAs buffer layer 42 was formed on an n-GaAs substrate 41 having a conventional (100) plane orientation, and this was followed by the formation of an n-Al$_{0.45}$Ga$_{0.55}$As cladding layer 43, a non-doped Al$_{0.15}$Ga$_{0.85}$As optical waveguide layer 44, a non-doped GaAs barrier layer 45, a non-doped In$_{0.2}$Ga$_{0.85}$As strained quantum well layer 46, a non-doped GaAs barrier layer 47, a non-doped Al$_{0.15}$Ga$_{0.85}$As optical waveguide layer 48, a p-Al$_{0.45}$Ga$_{0.55}$As cladding layer 49, and a p-GaAs cap layer 50. This was followed by the formation of a SiN$_x$ layer 51, a Mo/Au electrode layer 52 and a AuGe/Ni/Au electrode layer 53. With reference to FIG. 5, the region 55 of the GaAs substrate 41 in which the non-doped In$_{0.2}$Ga$_{0.85}$As strained quantum well active layer 46 is formed is cut so as to have a crystal orientation that is within ±10 degrees of the (111) surface plane (the other region 56 having a (100) orientation). In this way the active layer was provided with a crystal orientation that is within ±10 degrees of the (111) surface plane, for example an inclination of 0.5 degrees from the (111) B surface plane toward the (100) surface plane.

The InGaAs/GaAs/AlGaAs strained quantum well laser arrangement shown in FIG. 6 is substantially the same as that of the InGaAs/GaAs/AlGaAs strained quantum well laser arrangement shown in FIG. 3, being constituted as follows. An n-GaAs buffer layer 62 was formed on an n-GaAs substrate 61, and this was followed by the formation of an n-Al$_{0.5}$Ga$_{0.5}$As cladding layer 63, a non-doped Al$_{0.25}$Ga$_{0.75}$As optical waveguide layer 64, a non-doped In$_{0.05}$Ga$_{0.9}$Al$_{0.05}$As strained quantum well layer 65, a non-doped Al$_{0.25}$Ga$_{0.75}$As optical waveguide layer 66, a p-Al$_{0.5}$Ga$_{0.5}$As cladding layer 67, and a p-GaAs cap layer 68, then a SiN$_x$ layer 69, a Mo/Au layer 70, and a AuGe/Ni/Au layer 71. With reference to FIG. 6, thus, the region 72 of the GaAs substrate 61 in which the non-doped In$_{0.05}$Ga$_{0.9}$Al$_{0.05}$As strained quantum well layer 65 is formed may be provided with a crystal orientation that is within ±10 degrees of the (111) surface plane, for example an inclination of 0.5 degrees from the (111) B surface plane toward the (100) surface plane.

The invention has been described in detail with particular reference to a certain preferred embodiment thereof, but it will be understood that variations and modifications can be effected within the spirit and scope of the invention.

What is claimed is:

1. In a strained quantum well laser diode having a strained quantum well active layer and a plurality of layers on either side of the active layer, the improvement comprising:

wherein there is a difference of 0.1% or more between the lattice constant of the quantum well active layer and the lattice constant of layers adjacent to the quantum well active layer, and the quantum well active layer has a crystal orientation that is within ±10 degrees of the (111) surface plane.

2. The quantum well laser diode of claim 1 wherein the active layer is a non-doped quantum well layer made of InGaAs and having a thickness of 20 nm or less.

3. The quantum well laser diode of claim 1 wherein the active layer is selected from the group consisting of InGaAsAs, InGaAlAs and InGaAs.

* * * * *